(12) United States Patent
Piquette et al.

(10) Patent No.: US 10,903,384 B2
(45) Date of Patent: Jan. 26, 2021

(54) MULTI-COLOR PHOTO-DETECTOR

(71) Applicant: Teledyne Scientific & Imaging, LLC, Thousand Oaks, CA (US)

(72) Inventors: Eric Piquette, Camarillo, CA (US); Michael Carmody, Camarillo, CA (US); Peter Dreiske, Camarillo, CA (US)

(73) Assignee: TELEDYNE SCIENTIFIC & IMAGING, LLC, Thousand Oaks, CA (US)

(*) Notice: Subject to any disclaimer, the term of this patent is extended or adjusted under 35 U.S.C. 154(b) by 10 days.

(21) Appl. No.: 16/431,537

(22) Filed: Jun. 4, 2019

(65) Prior Publication Data

US 2020/0388718 A1    Dec. 10, 2020

(51) Int. Cl.
*H01L 31/101* (2006.01)
*H01L 31/02* (2006.01)
*H01L 31/18* (2006.01)
*H01L 27/144* (2006.01)
*H01L 31/0216* (2014.01)

(52) U.S. Cl.
CPC ...... *H01L 31/1013* (2013.01); *H01L 27/1443* (2013.01); *H01L 31/02005* (2013.01); *H01L 31/02161* (2013.01); *H01L 31/1868* (2013.01)

(58) Field of Classification Search
CPC .......... H01L 31/1013; H01L 31/02005; H01L 31/02161; H01L 31/1868; H01L 27/1443
See application file for complete search history.

(56) References Cited

U.S. PATENT DOCUMENTS

| | | | |
|---|---|---|---|
| 2002/0125472 A1* | 9/2002 | Johnson | H01L 31/03523 257/21 |
| 2009/0121307 A1* | 5/2009 | Tennant | H01L 27/1464 257/440 |
| 2018/0019269 A1* | 1/2018 | Klipstein | H01L 27/14647 |

* cited by examiner

*Primary Examiner* — Christine A Enad
(74) *Attorney, Agent, or Firm* — Snell & Wilmer LLP

(57) ABSTRACT

A multi-color light detector includes a first photodiode. The light detector further includes a second photodiode stacked on the first photodiode and defining a via. The light detector further includes a first conductor extending through the via, contacting the first photodiode, and designed to transmit a first signal corresponding to a first light detected by the first photodiode. The light detector further includes a second conductor contacting the second photodiode and designed to transmit a second signal corresponding to a second light detected by the second photodiode.

17 Claims, 11 Drawing Sheets

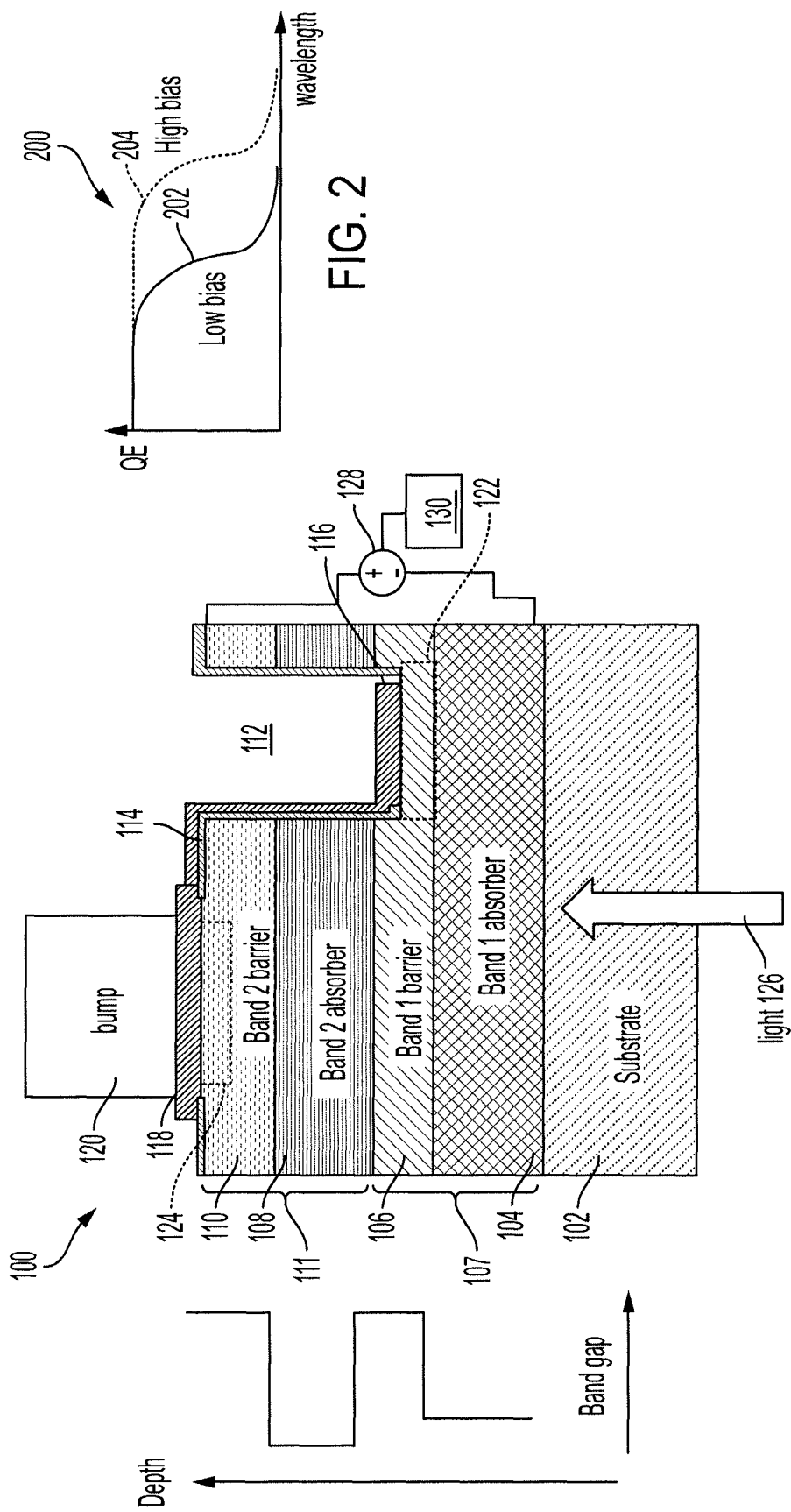

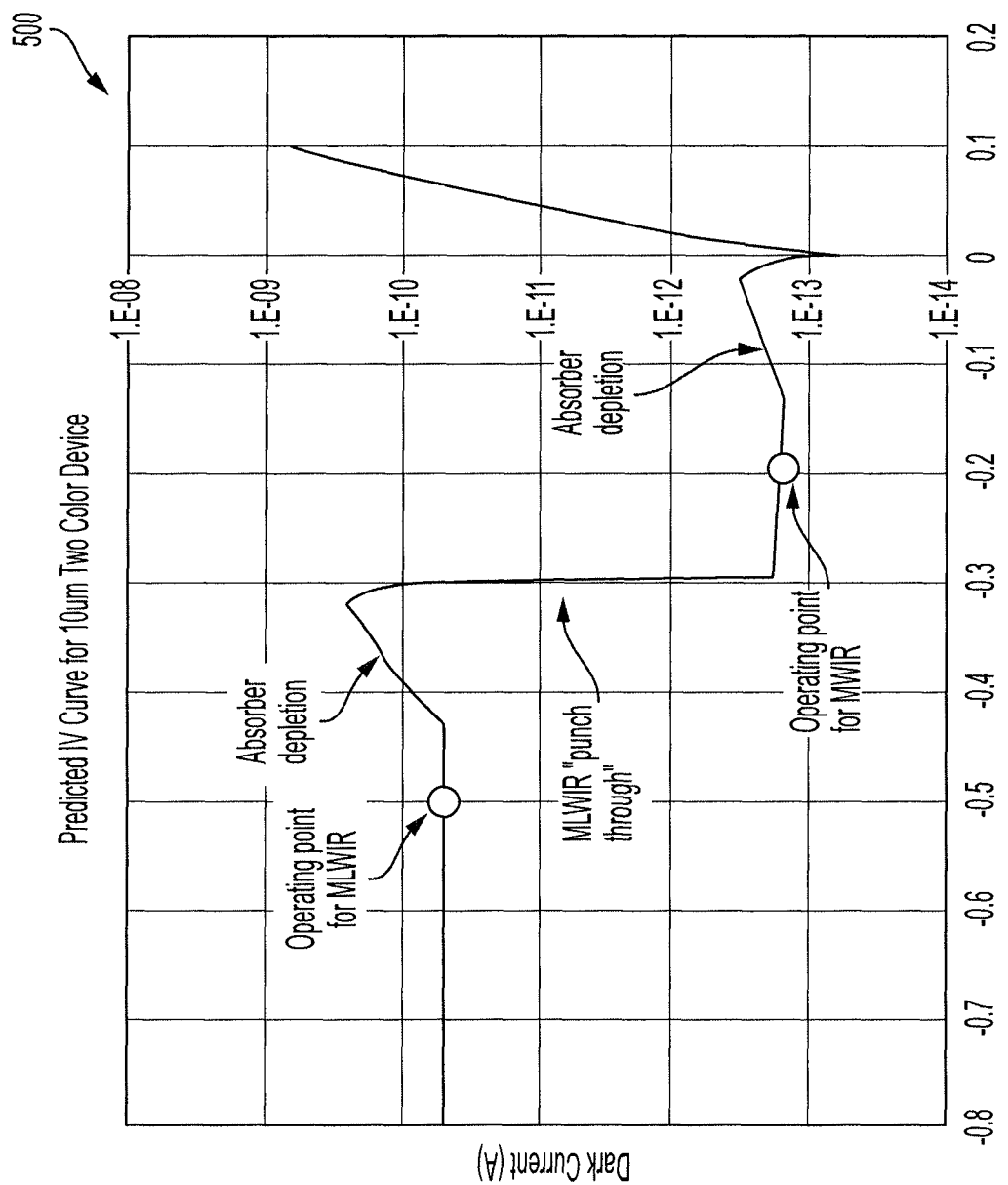

MULTI-COLOR PHOTO-DETECTOR

STATEMENT REGARDING GOVERNMENT RIGHTS

The government has certain rights in the invention.

BACKGROUND

1. Field

This disclosure is directed to light detectors and, more particularly, to a light detector capable of detecting multiple colors of light.

2. Description of the Related Art

Light sensors are used for various applications in multiple settings. Depending on the use of the light sensor, relatively high accuracy may be important. For example, light sensors may be used in night vision cameras or goggles to detect infrared light in dark environments. It may be desirable for a light detector to detect light having multiple colors, or ranges of wavelengths, in various situations.

Conventional multi-color light detectors may be difficult, if not impossible, to fabricate to desired specifications. For example, some such conventional detectors rely on architectures that utilize a mesa photodiode, which presents difficulties in passivating a PN-junction sidewall. Etching of mesas further reduces fill factor and makes transitioning to small pixels difficult. Additionally, multiple terminal solutions are also difficult to scale to small pixel pitch due to the requirement of using more than one interconnect bump per cell, and due to each bump having a different height. These conventional solutions are mostly limited to two colors, which may be undesirable if more colors are desired.

Accordingly, there is a need in the art for improved light detectors that detect multiple colors of light and are relatively easy to fabricate.

SUMMARY

Described herein is a multi-color light detector. The light detector includes a first photodiode. The light detector further includes a second photodiode stacked on the first photodiode and defining a via. The light detector further includes a first conductor extending through the via, contacting the first photodiode, and designed to transmit a first signal corresponding to a first light detected by the first photodiode. The light detector further includes a second conductor contacting the second photodiode and designed to transmit a second signal corresponding to a second light detected by the second photodiode. The second photodiode is designed to turn on at a higher applied bias than the first photodiode.

Also disclosed is a multi-color light detector. The light detector includes a first band absorber. The light detector further includes a second band absorber placed behind the first band absorber, relative to incident light. The light detector further includes a first band barrier located between the first band absorber and the second band absorber. The light detector further includes a second band barrier positioned such that the second band absorber is located between the first band barrier and the second band barrier. The light detector contains a via through the second band barrier and second band absorber, ending in the first band barrier or first band absorber. The light detector further includes a first conductor extending through the via and contacting a p-n or Schottky diode junction at the first band barrier or first band absorber. The light detector further includes a second conductor contacting the second band barrier at a p-n or Schottky diode junction. The first conductor and second conductor are in contact forming a single electrical element, such that the contacted junctions are electrically connected in parallel.

Also disclosed is a method for forming a multi-color light detector. The method includes depositing on a substrate, in order, a first band absorber, a first band barrier, a second band absorber, and a second band barrier. The method further includes forming, through a portion of the second band barrier, a via into the second band absorber. The method further includes formation of p-n or Schottky diode junctions at the second band barrier and the first band barrier or absorber. The method further includes placing a first conductor through the via such that the first conductor contacts the diode at the first band barrier or first band absorber. The method further includes placing a second conductor in contact with the diode at the second band barrier.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

FIG. 1 is a cross-sectional view of a multi-color light detector according to an aspect of the invention;

FIG. 2 is a graph illustrating spectral response of the light detector of FIG. 1 according to an aspect of the invention;

FIG. 5 is a plot illustrating a modeled voltage-current curve of a multi-color light detector according to an aspect of the invention;

DETAILED DESCRIPTION

Figures 3A, 3B:
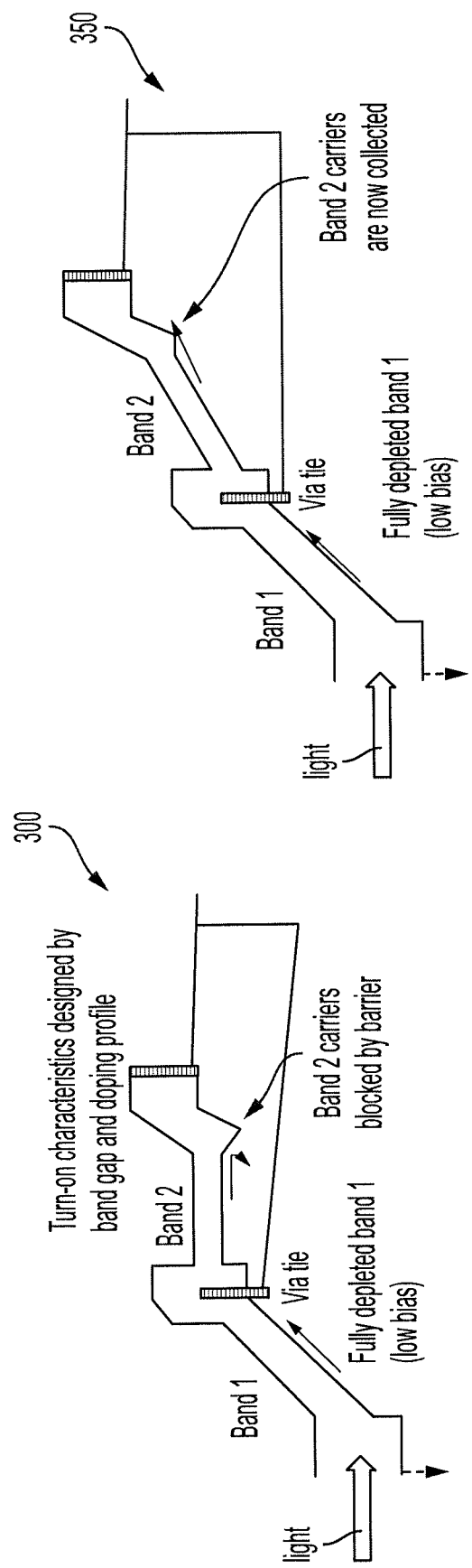
FIGS. 3A and 3B are band diagrams illustrating operation of the light detector of FIG. 1 according to an aspect of the invention.

Disclosed herein are various light detectors and methods for making the same. The light detectors are capable of detecting multiple "colors" (i.e., multiple wavelength ranges) of light, and are relatively easy to fabricate. The detectors may be formed by stacking multiple photodiodes on top of each other and forming one or more via through the top layers to facilitate electrical connection to the lower-layered photodiodes. This architecture allows for scaling down pixel size of the device and for scaling up a quantity of detectable colors while not sacrificing resolution or ease of fabrication.

Referring now to FIG. 1, a single pixel of a multi-color light detector 100 is shown. The light detector 100 may be formed on a substrate 102 which may be transparent or translucent to the colors of interest of the light detector 100. For example, a first photodiode 107 may be formed directly on the substrate 102, and a second photodiode 111 may be formed on the first photodiode 107. A via 112 may be formed through the second photodiode 111 and a portion of the first photodiode 107. A first conductor 116 may extend through the via 112 and receive current from the first photodiode 107 corresponding to light detected by the first photodiode 107. A second conductor 118 may be coupled to the second photodiode 111 and may receive current from the second photodiode 111 corresponding to light detected by the second photodiode 111.

A bump 120, such as an indium bump, may be electrically connected to the first conductor 116 and the second conductor 118, serving as output-terminal. For example, the bump 120 may be grown on the light detector 100. The bump 120 may receive a first signal from the first photodiode 107 via the first conductor 116 and may receive a second signal from the second photodiode 111 via the second conductor 118. In that regard, the bump 120 may output a combined signal corresponding to light detected by the first photodiode 107 and by the second photodiode 111.

The first photodiode 107 may be designed to detect light of a first color (corresponding to a first range of light wavelengths), and the second photodiode 111 may be designed to detect light of a second color that is different than the first color (corresponding to a second range of light wavelengths). In that regard, the bump 120 may receive a signal if the light detector 100 detects light of the first color or of the second color.

The first photodiode 107 may be created by forming a first band absorber 104 on the substrate 102 and then forming a first band barrier 106 on the first band absorber 104. In some embodiments, the light detector 100 may be substrate-free. That is, the substrate 102 may be removed from the light detector 100 prior to use.

The second photodiode 111 may be created by forming a second band absorber 108 on the first band absorber 106 and then forming a second band barrier 110 on the second band absorber 108. The second photodiode is designed such that the diode depletion region punches through the second band barrier into the second band absorber, and so 'turns on' the second photodiode, at a higher reverse bias than the 'turn on' bias for the first photodiode. In some embodiments, the first band absorber 104, the first band barrier 106, the second band absorber 108, and the second band barrier 110 may each be formed from a N-type material, may each be formed from a P-type material, or may include some N-type material and some P-type material (forming one or more PN junction photodiode).

The via 112 may extend entirely through the second band absorber 108 and the second band barrier 110. In some embodiments, the via 112 may extend partially into the first band barrier 106. The via 112 may extend sufficiently far into the first band barrier 106 to reduce the likelihood of the first conductor 116 receiving current generated by the second photodiode 111 (and in particular from the second band absorber 108).

The first conductor 116 may extend through the via 112 and contact the first band barrier 106, creating an electrical connection from the bump 120 to the first band absorber 104 (and thus the first photodiode 107). The second conductor 118 may contact both the second band barrier 110 in the bump 120. In that regard, the second conductor 118 may transmit a signal from the second band barrier 110 (and thus the second photodiode 111) to the bump 120.

A passivation material 114 may be located between the conductors 116, 118 and the material of the first band barrier 106, the second band absorber 108, and the second band barrier 110. The passivation material 114 may insulate the conductors 116, 118 from each of the first band barrier 106, the second band absorber 108, and the second band barrier 110.

A first depletion region 122 extends into the first band barrier 106 from the via 112, and a second depletion region 124 extends into the second band barrier 110. The depletion region may originate from a PN-diode junction or a Schottky junction.

A voltage source 128 may be coupled to the light detector 100. In particular, the voltage source 128 may be electrically connected to the terminal bump 120, thus applying voltage through the deposited conductors 116, 118 to the band 1 and band 2 photodiode junctions 122 and 124. Differential in voltage between the second band barrier 110 and the first band absorber 104 may create an electrical bias within the light detector 100. The first band absorber acts as a common electrical substrate to the detector, and may also be connected to the second band absorber.

In response to application of a first voltage that is less than a threshold voltage (the absolute value of the first voltage may be 0 volts or greater), the first depletion region 122 may extend into the first band absorber 104. This allows current (corresponding to light detected by the first photodiode 107) to travel through the depletion region 122 and reach the first conductor 116. However, application of the first voltage results in the second depletion region 124 remaining within the second band barrier 110 and thus preventing the second photodiode 111 from transmitting a signal to the second conductor 118. In that regard and in response to application of the first voltage, a signal only corresponding to light detected by the first photodiode 107 is transmitted to the bump 120.

In response to application of a second voltage having an absolute value that is greater than or equal to the threshold voltage (the absolute value being greater than the first voltage), the first depletion region 122 may again extend through the first band barrier 106 and reach the first band absorber 104. The threshold voltage may correspond to a voltage that is sufficiently great to turn on the second photodiode 111). This again allows current (corresponding to light detected by the first photodiode 107) to travel through the depletion region 122 and reach the first conductor 116. Similarly, the second depletion region 124 may also extend through the second band barrier 110 and reach the second band absorber 108. This allows current (corresponding to light detected by the second photodiode 111) to travel through the depletion region 124 and reach the second conductor 118. In that regard and in response to application of the second voltage (being greater than the threshold voltage), a first signal corresponding to light detected by the first photodiode 107 and a second signal corresponding to light detected by the second photodiode 111 are both transmitted to the bump 120.

In some embodiments, the first conductor 116 and the second conductor 118 may include a single conductor, with the portion that contacts the first band barrier 106 being referred to as the first conductor 116 and the portion that contacts the second band barrier 110 being referred to as the second conductor 118. In some embodiments, the first conductor 116 and the second conductor 118 may be separate and may contact separate bumps. In some embodiments, the first conductor 116 and the second conductor 118 may be separate and both contact the bump 120 (the bump 120 electrically connecting the first conductor 116 to the second conductor 118).

In some embodiments in which the first conductor 116 and the second conductor 118 are electrically connected, the bump 120 may receive a single signal that corresponds to a combination of light detected by the first photodiode 107 and light detected by the second photodiode 111 (in response to the absolute value of the voltage being greater than or equal to the threshold voltage).

An input device 130 (such as a button, switch, or the like) may be coupled to the voltage source 128 and may toggle the voltage source 128 between the first voltage and the second voltage. In that regard, the input device 130 may be used to control operation of the light detector 100. For example, a user may use the input device 130 to cause the voltage source 128 to apply the first voltage, resulting in only the first photodiode 107 generating a signal. The user may then use the input device 130 to cause the voltage source 128 to apply the second voltage, resulting in both the first photodiode 107 and the second photodiode 111 generating signals. In this way, the user may adjust the colors of light detected by the light detector 100.

The embodiment illustrated in FIG. 1 is a dual-band light detector 100. The detector 100 may be formed as a stacked p-on-n photodiode, with the photodiodes connected in parallel using a via-tie, where the second band incorporates a higher turn-on bias than the first band. At low bias, there is a heterostructure barrier in the valence band between the second band absorber 108 and the second band barrier 110, so no signal is collected for the second band at low bias. There is no barrier for the first band at low bias. A common connection is made to the substrate 102 while the signal flows through the conductors 116, 118 which shorts the two detector junctions.

The light detector 100 is dual color and is compatible with pixel pitch of 10 micrometers or smaller. The light detector 100 is further capable of withstanding relatively great operating temperatures, such as temperatures up to 210 degrees Kelvin.

Referring now to FIG. 2, a plot 200 illustrates quantum efficiency, or spectral response, of the light detector 100 of FIG. 1. The X axis illustrates wavelength response and the Y axis illustrates quantum efficiency. A first line 202 corresponds to quantum efficiency at a low bias (corresponding to a voltage below the threshold voltage), and a second line 204 corresponds to quantum efficiency at a high bias (corresponding to a voltage at or above the threshold voltage).

Referring now to FIGS. 3A and 3B, band diagrams 300, 350 illustrate detection of bands in various scenarios. In particular, FIG. 3A is a band diagram 300 illustrating operation of the light detector 100 of FIG. 1 at the low bias, and FIG. 3B is a band diagram 350 illustrating operation of the light detector 100 of FIG. 1 at the high bias. Although FIGS. 3A and 3B generally illustrate full depletion performance, the light detector 100 of FIG. 1 may operate without full depletion of the photodiodes.

Figure 4B:
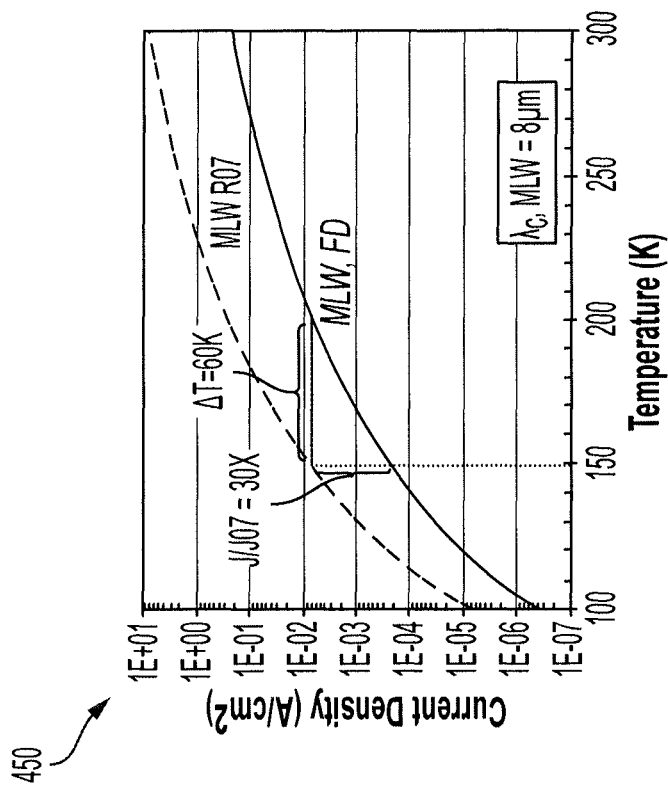
FIGS. 4A and 4B are plots illustrating estimated dark current in multi-color light detectors according to an aspect of the invention.
Figure 4A:
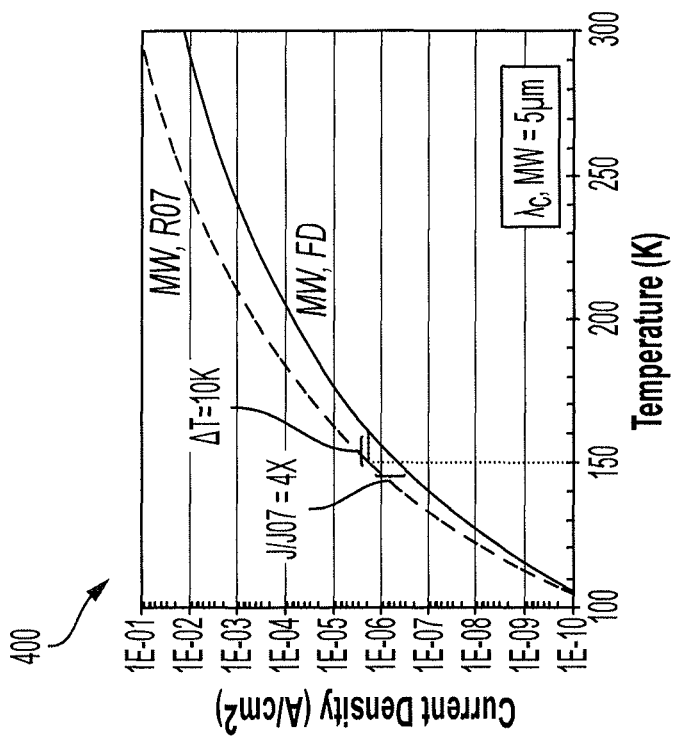

Turning to FIGS. 4A and 4B, a first plot 400 illustrates estimated dark current in a MW light detector (having a similar structure as the light detector 100 of FIG. 1), and a second plot 450 illustrates estimated dark current in a MLW light detector (having a similar structure as the light detector 100 of FIG. 1). The plots 400, 450 illustrate performance data for single diodes, but the data may be extrapolated to multiple-diode light detectors. The dark currents are estimated based on substrate-on radiative limit achieved on single-color detectors in the provided wavelength range. As shown, the design of the light detector 100 of FIG. 1 likely reduces dark current throughout the light detector 100.

FIG. 5 is a plot 500 showing a modeled current/voltage curve illustrating operating points for operation of the first band alone and the combination of the first band and the second band of the light detector 100 of FIG. 1. Dark current vs bias shown in FIG. 5 for an example 5 micron/8 micron cutoff two-color light detector (where the threshold voltage is −0.3 volts) illustrates that the 5 micron cutoff is achieved at low bias (near −0.2 volts) and the 8 micron cutoff operates near −0.5 volts. These bias points are controlled in the design by the thickness and doping levels of the barrier layers of the light detector.

Figure 6:
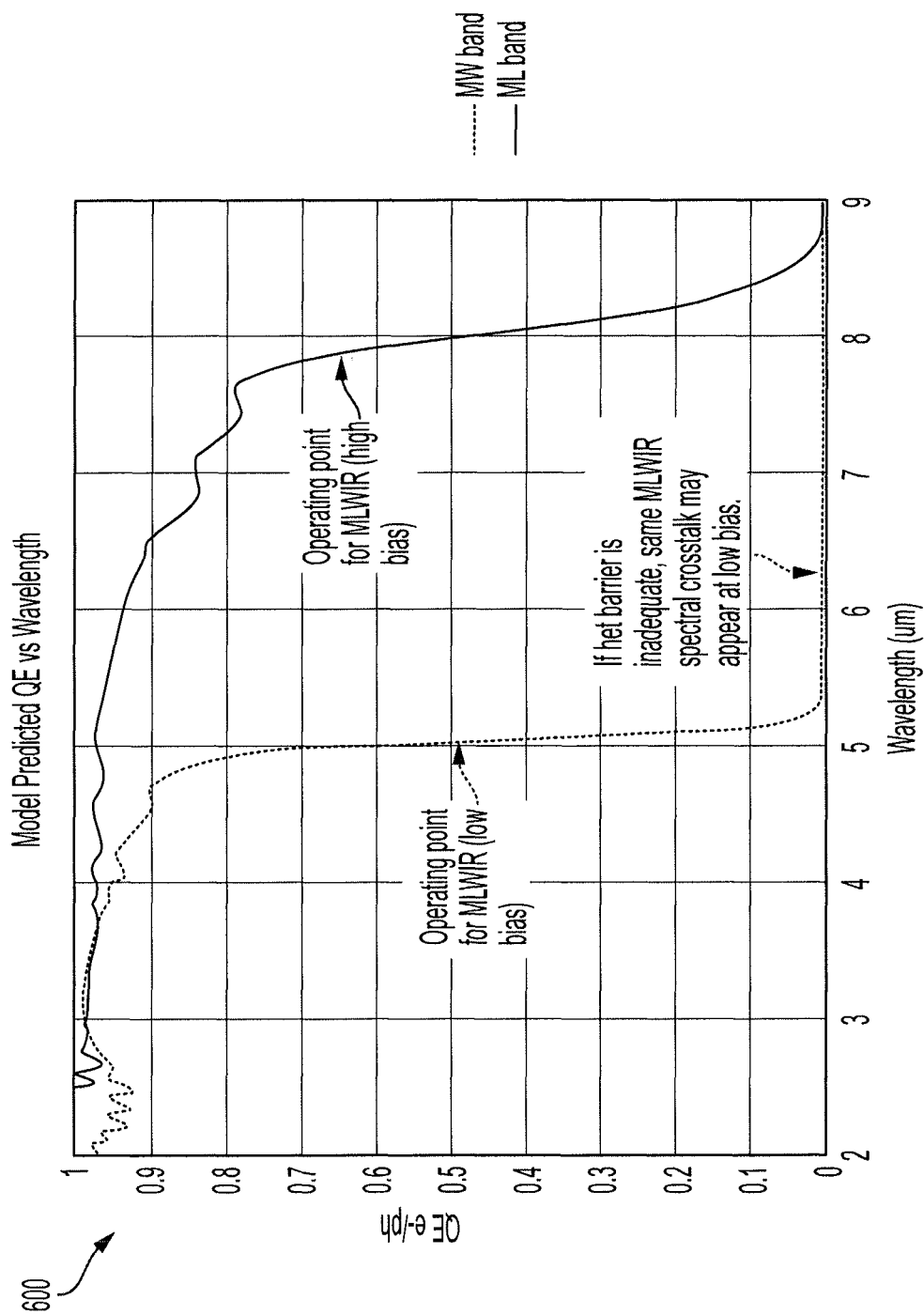
FIG. 6 is a graph illustrating model-predicted spectral response of a multi-color light detector according to an aspect of the invention.

FIG. 6 is a plot 600 illustrating a model-predicted spectral response of the light detector 100 of FIG. 1. Cutoff extends from 5 microns (at a bias of −0.2 volts) to 8 microns (at a bias of −0.5 volts). This model can be combined with the model shown in FIG. 5 for color discrimination as advantaged by the sensor application.

Figures 7A, 7B:
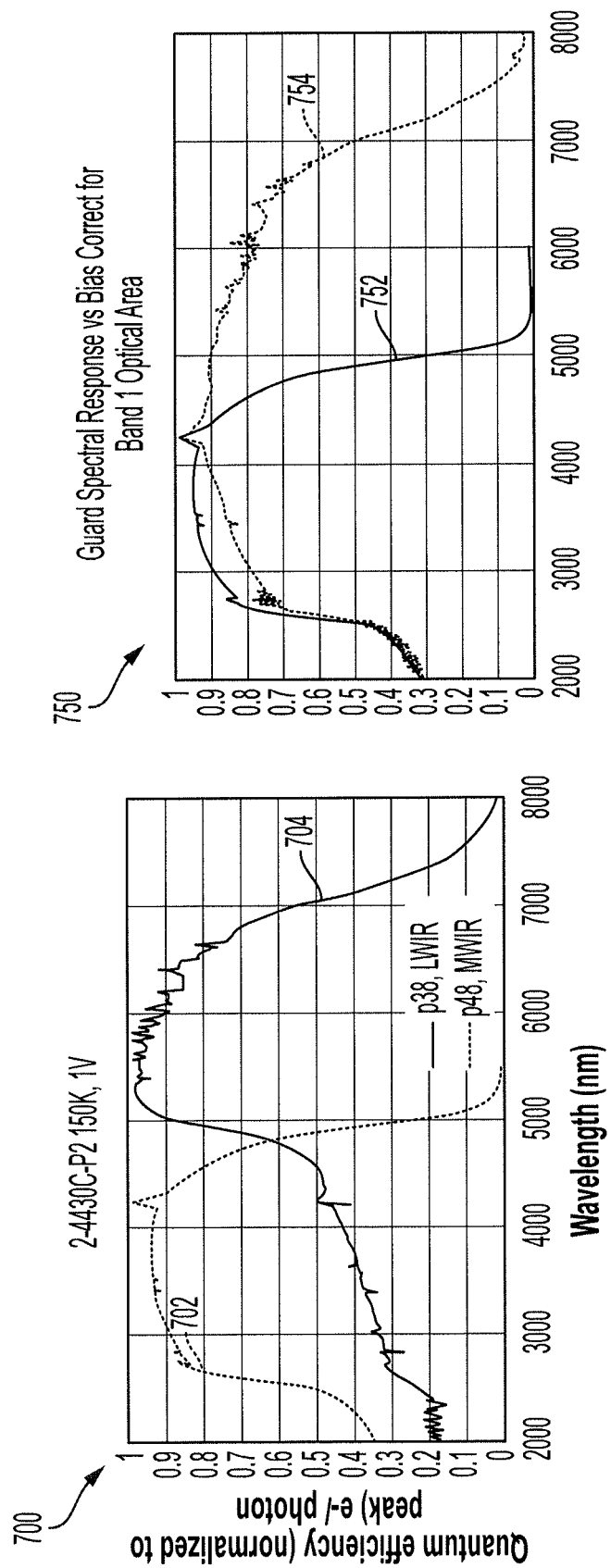
FIGS. 7A and 7B are plots illustrating spectral response of a dual-output multi-color light detector and a single output multi-color light detector, respectively, according to an aspect of the invention.

FIGS. 7A and 7B show plots illustrating measured spectral response. FIG. 7A illustrates a plot 700 that shows measured spectral response for a light detector that has separate outputs for the first band and the second band. In particular, a first line 702 corresponds to, a spectral response of the first band, and a second line 704 corresponds to a spectral response of the second band.

FIG. 7B illustrates a plot 700 that shows measured spectral response for a light detector that has a single output for both bands (similar to the light detector 100 of FIG. 1). A first line 752 illustrates spectral response of the first band (when the bias is less than the threshold voltage), and a second line 754 illustrates spectral response of the combined first band and second band (when the bias is greater than or equal to the threshold voltage).

Figure 8:
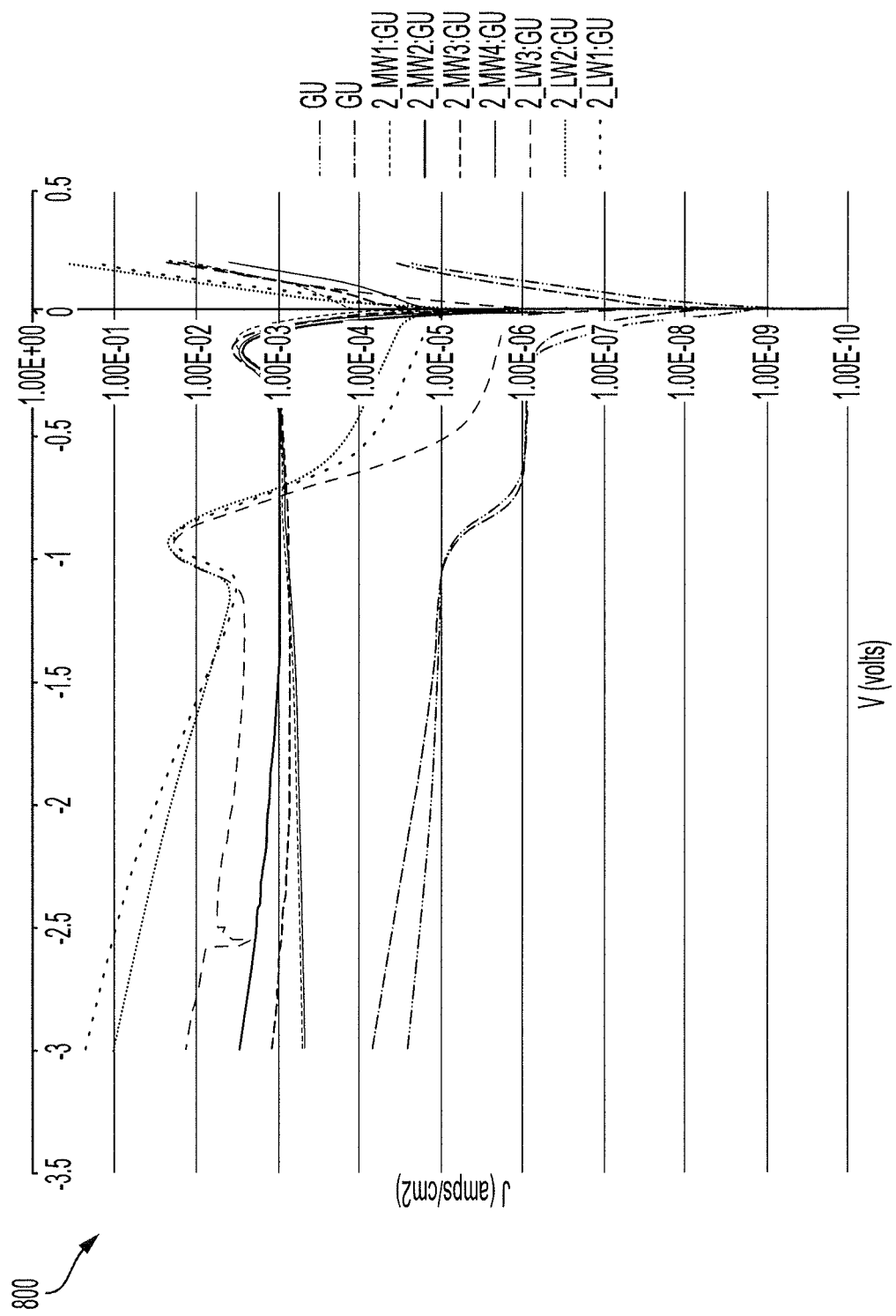
FIG. 8 is a graph illustrating J-V curves of a multi-color light detector according to an aspect of the invention.

FIG. 8 is a plot illustrating dark current for modeled light detectors. Dark current for three types of light detectors are shown, including a MWIR, a MLWIR, and a guard structure. The guard is a device similar to the light detector 100 of FIG. 1 that encompasses a perimeter of the DUT and with both bands shorted together (i.e., the current is summed). The guard is thus a demonstration of a combined two-color single-bump light detector. As shown, at low reverse biases, only dark current from the first band is collected. However, at higher biases (i.e., once the valence band barrier in the second band is overcome) dark current from both bands is collected.

Figure 9:
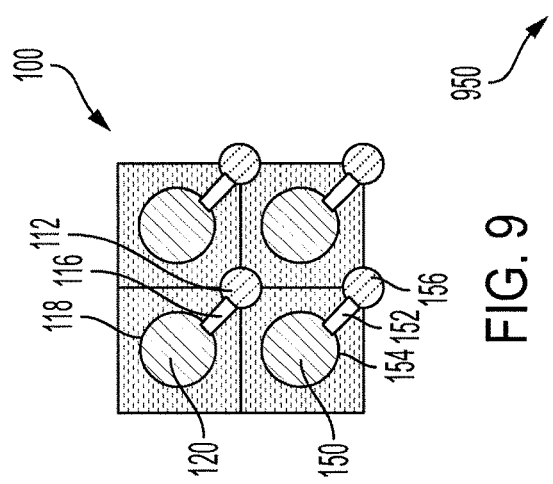
FIG. 9 is a plan view of a multi-color light detector having multiple pixels according to an aspect of the invention.

Referring now to FIG. 9, the light detector 100 of FIG. 1 may be expanded to create a multiple pixel light detector 100 in which each pixel is capable of detecting multiple colors. As shown, the first pixel includes the bump 120 located on the second conductor 118 along with the first conductor 116 extending to the via 112. A second pixel may be formed by forming another via 156 separated from the first via 112 by a distance and extending a conductor 152 into the via 156 to contact the first band barrier (barrier 106 of FIG. 1). A second conductor 154 may be electronically connected to the second band barrier. The second via 156 may be located closer to the conductor 154 than the conductor 118. A bump 150 may be coupled to the conductors 152, 154 and may output data corresponding to one or more colors of light detected by the second pixel.

Figure 10B:
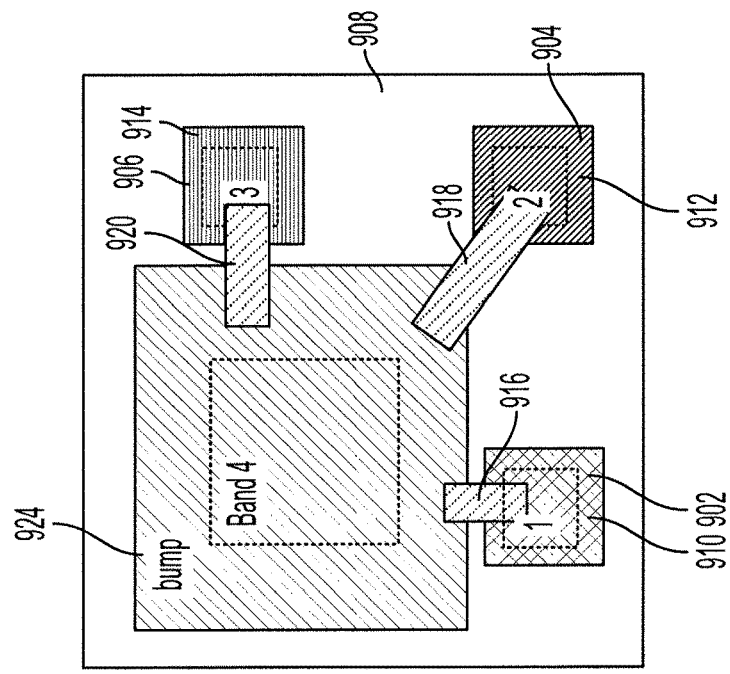
FIG. 10B is a plan view of the multi-color light detector of FIG. 10A according to an aspect of the invention.
Figure 10A:
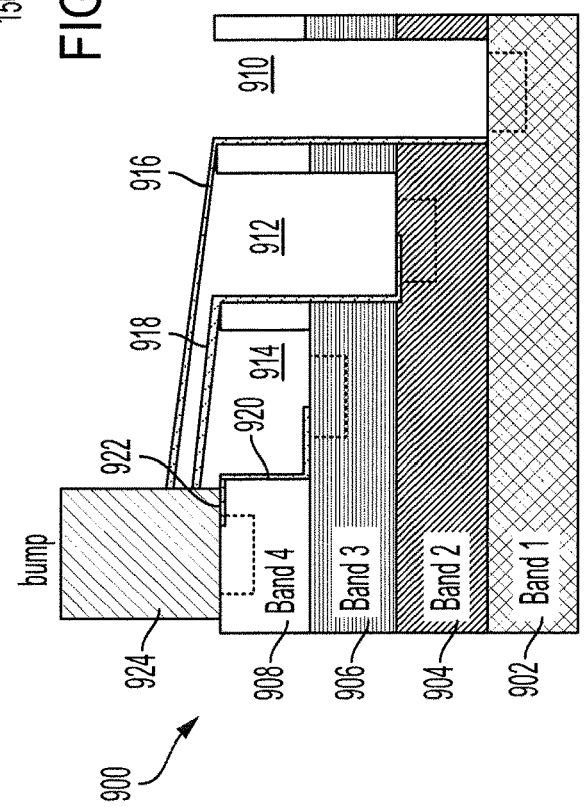
FIG. 10A is a cross-sectional view of a multi-color light detector capable of detecting 4 different colors according to an aspect of the invention.

Turning now to FIGS. 10A and 10B, a multi-color light detector 900 may be designed to detect more than four colors. In particular, the light detector 900 may include a first band 902, a second band 904, a third band 906, and a fourth band 908. In that regard, the light detector 900 may be designed to detect light of four colors. Each of the bands 902, 904, 906, 908 may correspond to a photodiode and may be configured similar to the bands shown in FIG. 1. That is, each of the bands 902, 904, 906, 908 may include an absorber layer and a barrier layer located on the absorber layer.

Multiple vias may be formed in the light detector 900. In particular, a first via 910 may be formed through the second band 904, the third band 906, and the fourth band 908, and a first conductor 916 may extend through the first via 910 and contact the first band 902. A second via 912 may be formed through the third band 906 and the fourth band 908, and a second conductor 918 may extend through the second via 912 and contact the second band 904. A third via 914 may be formed through the fourth band 908, and a third conductor 920 may extend through the third via 914 and contact the third band 906. A fourth conductor 922 may be coupled to the fourth band 908. Each of the conductors 916, 918, 920, 922 may be electrically connected to a bump 924. In that regard, the bump 924 may output light detected by any of the four photodiodes, or bands.

Figure 11:
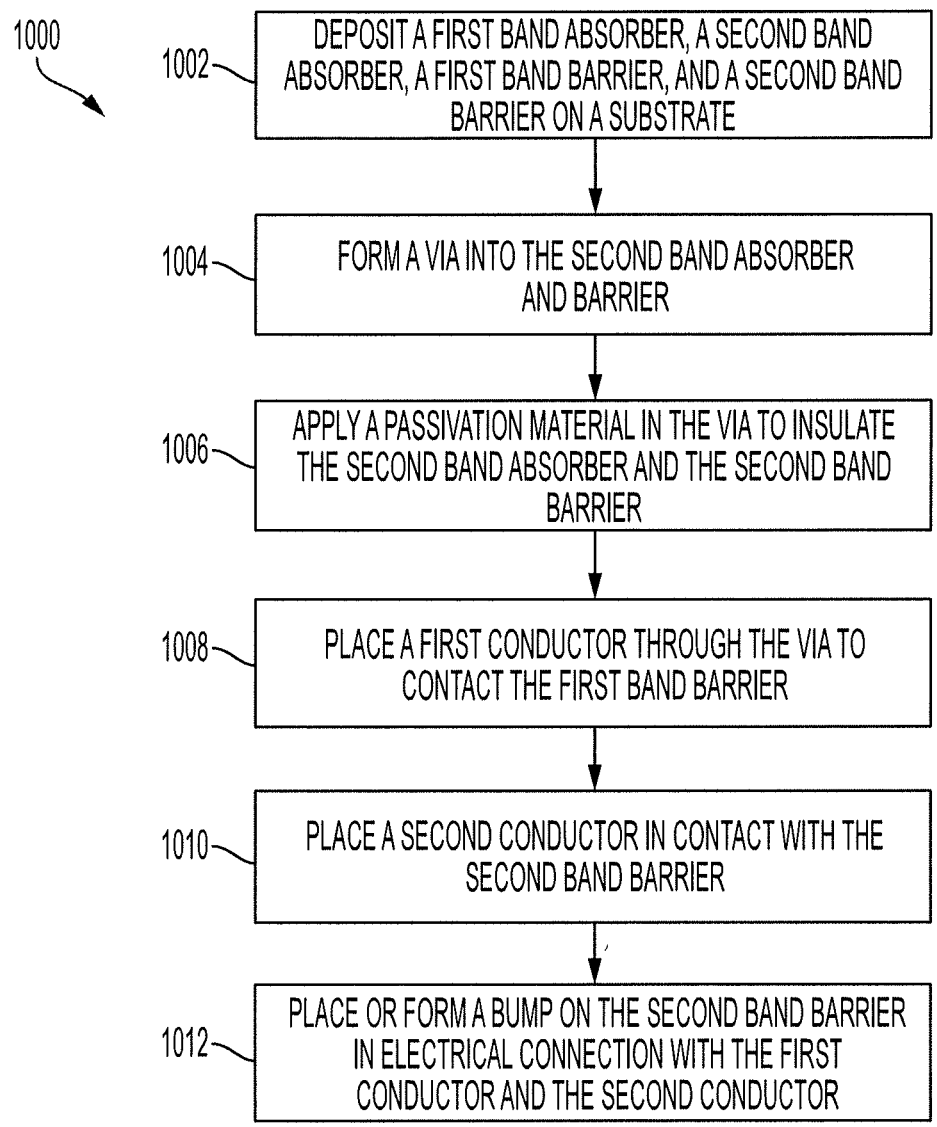
FIG. 11 is a flowchart illustrating a method for forming a multi-color light detector according to an aspect of the invention.

Referring to FIG. 11, a method 1000 may be used to form a multiple color light detector, such as the light detector 100 of FIG. 1. In block 1002, a first band absorber, a second band absorber, a first band barrier, and a second band barrier may be deposited, grown, or formed on a substrate. The absorbers and barriers may be oriented in a similar manner as shown in FIG. 1.

In block 1004, a via may be formed through the second band absorber and the second band barrier and may extend partially into the first band barrier in a similar manner as FIG. 1.

In block 1006, a passivation material may be applied, deposited, or the like into the via (and partially over the second band absorber) to insulate the second band absorber and the second band barrier.

In block 1008, a first conductor may be placed or deposited into the via in such a manner that it is electrically coupled to the first band barrier.

In block 1010, a second conductor may be placed on the second band barrier and be electrically coupled to the second band barrier.

In block 1012, a bump, such as an indium bump, may be placed on the second band barrier in such a manner that it is electrically coupled to the first conductor and the second conductor.

Although blocks 1008-1012 are shown as being separate blocks, one skilled in the art will realize that each of these blocks may be performed separately or any two or more of these blocks may be performed simultaneously.

Figure 12:
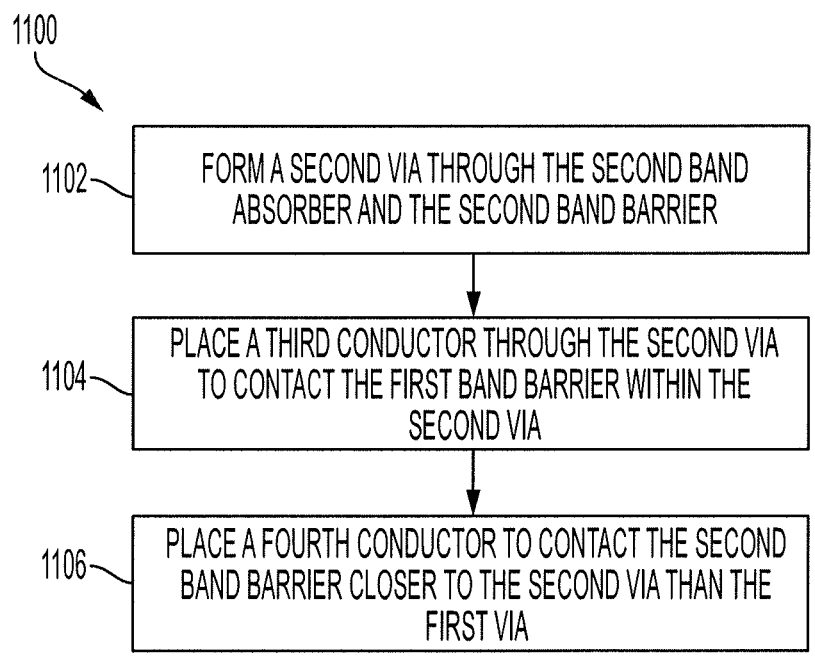
FIG. 12 is a flowchart illustrating a method for forming a multi-pixel multi-color light detector according to an aspect of the invention.

Referring now to FIG. 12, a method 1100 may be used to create multiple pixels similar to the single pixel light detector formed using the method 1000 of FIG. 11. The method 1100 may be used in combination with the method 1000 of FIG. 11.

In particular and in block 1102, a second via may be formed through the second band absorber and the second band barrier. The second via may be located at a distance from the first via.

In block 1104, a third conductor may be placed through the second via to contact the first band barrier within the second via. In block 1106, a fourth conductor may be placed on the second band barrier at a location closer to the second via than the first via. A second bump may be electrically connected to the third conductor and the fourth conductor and may function as an output signal for the second pixel.

Although block 1104 is shown as being separate from blocks 1008-1012, one skilled in the art will realize that each of these blocks may be performed separately or any two or more of these blocks may be performed simultaneously.

Figure 13:
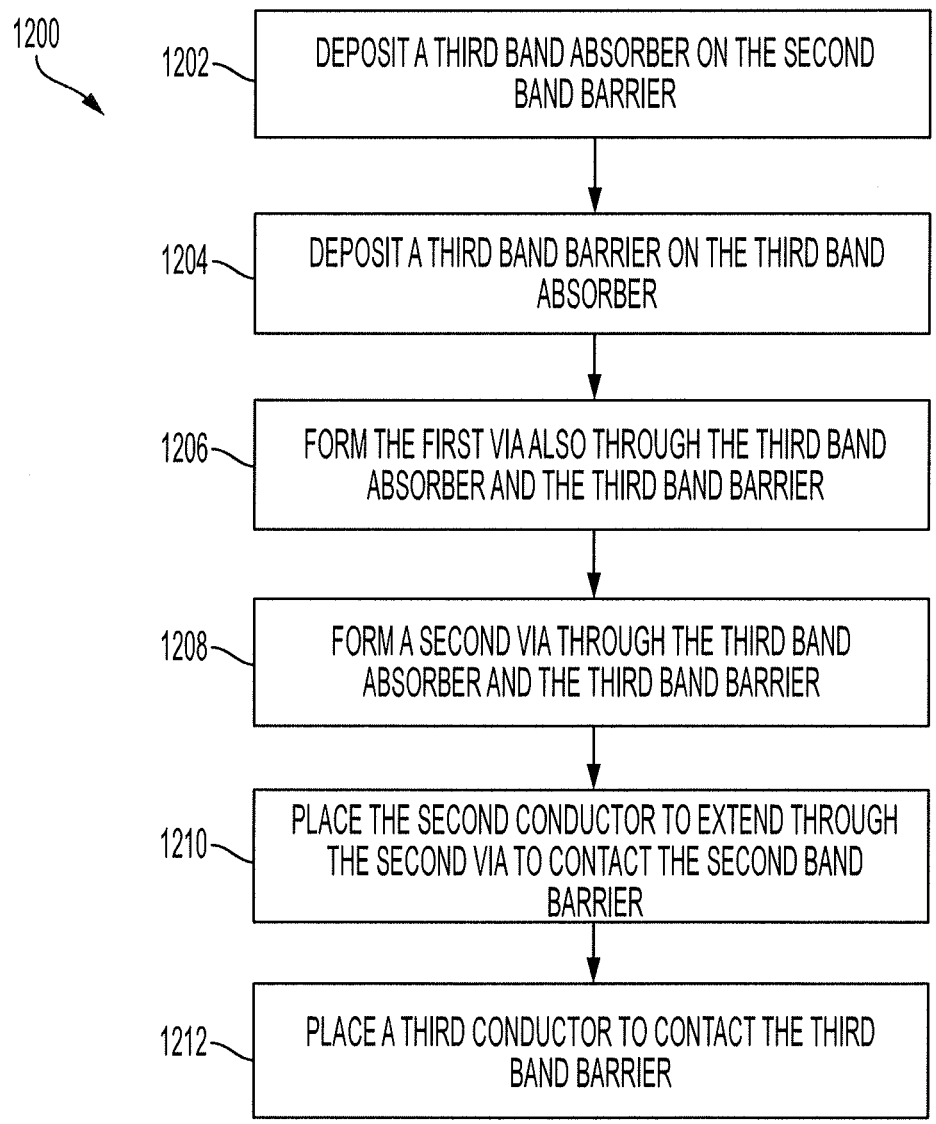
FIG. 13 is a flowchart illustrating a method for forming a multi-color light detector capable of detecting more than two colors according to an aspect of the invention.

Turning to FIG. 13, a method 1200 may be used to form a light detector capable of detecting more than two lights. The blocks of the method 1200 may be performed together with the method 1000 of FIG. 11.

In block 1202, a third band absorber may be deposited or formed on the second band barrier, and in 1204 a third band barrier deposited or formed on the third band absorber.

In block 1206, the first via may also be formed through the third band absorber and the third band barrier. In block 1208, a second via may be formed through the third band absorber and the third band barrier to expose a portion of the second band barrier.

In block 1210, the second conductor may be extended through the second via in order to contact the second band barrier. In block 1212, a third conductor may be positioned on the third band barrier and electrically coupled to the third band barrier.

As referenced above, one skilled in the art will realize that the deposition of each of the metals may be performed separately or two or more of these blocks may be performed simultaneously.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A multi-color light detector, comprising:
   a first photodiode;
   a second photodiode stacked on the first photodiode and defining a first via;
   a first conductor extending through the first via, contacting the first photodiode, and configured to transmit a first signal corresponding to a first light detected by the first photodiode;
   a second conductor contacting the second photodiode, at least partially defining a second via that is separated from the first via by a distance, and configured to transmit a second signal corresponding to a second light detected by the second photodiode;
a third conductor extending through the second via and contacting the first photodiode within the second via; and
a fourth conductor contacting the second photodiode at a location closer to the second via than the first via such that the first conductor and the second conductor correspond to a first pixel of a light sensor and the third conductor and the fourth conductor correspond to a second pixel of the light sensor.

2. The multi-color light detector of claim 1 further comprising a passivation material at least partially lining the first via and insulating the first conductor from the second photodiode.

3. The multi-color light detector of claim 1 further comprising a bump electrically connected to the first conductor and the second conductor and configured to receive and output the first signal and the second signal.

4. The multi-color light detector of claim 1 where:
the multi-color light detector is configured to receive an electrical bias;
the first photodiode is configured to convert the first light having a first wavelength into a first electrical current in response to a first amount of the electrical bias being applied to the multi-color light detector; and
the first photodiode is configured to convert the first light having the first wavelength into the first electrical current and the second photodiode is configured to convert the second light having a second wavelength that is greater than the first wavelength into a second electrical current in response to a second amount of the electrical bias that is greater than the first amount of the electrical bias being applied to the multi-color light detector.

5. The multi-color light detector of claim 1 further comprising:
a third photodiode stacked on the second photodiode; and
a fifth conductor,
wherein:
the third photodiode at least partially defines the first via and a third via,
the second conductor extends through the third via to contact the second photodiode, and
the fifth conductor contacts the third photodiode.

6. A multi-color light detector, comprising:
a first band absorber;
a second band absorber at least partially defining a first via;
a third band barrier at least partially defining the first via and a second via;
a third band absorber located between the second band barrier and the third band barrier and at least partially defining the first via and the second via;
a first band barrier located between the first band absorber and the second band absorber;
a second band barrier at least partially defining the via and positioned such that the second band absorber is located between the first band barrier and the second band barrier;
a first conductor extending through the via and contacting the first band barrier;
a second conductor extending through the second via to contact the second band barrier; and
a third conductor contacting the third band barrier.

7. The multi-color light detector of claim 6 further comprising a passivation material at least partially lining the first via and insulating the first conductor from the second band absorber and the second band barrier.

8. The multi-color light detector of claim 6 further comprising a bump positioned such that the second band barrier is located between the second band absorber and the bump, the bump electrically connected to the first conductor and the second conductor and configured to receive electrons corresponding to detected light.

9. The multi-color light detector of claim 6 wherein the first band absorber and the first band barrier together operate as a first photodiode, and the second band absorber and the second band barrier together operate as a second photodiode.

10. The multi-color light detector of claim 9 wherein:
the multi-color light detector is configured to receive an electrical bias;
the first photodiode is configured to convert a first light of a first wavelength into a first electrical current in response to a first amount of the electrical bias being applied to the multi-color light detector; and
the first photodiode is configured to convert the first light of the first wavelength into the first electrical current and the second photodiode is configured to convert a second light of a second wavelength that is greater than the first wavelength into a second electrical current in response to a second amount of the electrical bias that is greater than the first amount of the electrical bias being applied to the multi-color light detector.

11. The multi-color light detector of claim 6 further comprising a fourth conductor and a fifth conductor, wherein:
the second band absorber and the second band barrier each at least partially define a third via that is separated from the first via;
the fourth conductor extends through the third via and contacts the first band barrier within the third via;
the fifth conductor contacts the second band barrier at a location closer to the third via than the first via; and
the first conductor and the second conductor correspond to a first pixel of a light sensor and the fourth conductor and the fifth conductor correspond to a second pixel of the light sensor.

12. The multi-color light detector of claim 6 further comprising a substrate positioned such that the first band absorber is located between the first band barrier and the substrate, wherein light is received by the multi-color light detector at the substrate.

13. The multi-color light detector of claim 12 wherein the substrate is transparent to light of a wavelength of which the multi-color light detector is designed to detect.

14. A method for forming a multi-color light detector, comprising:
depositing on a substrate, in order, a first band absorber, a first band barrier, a second band absorber, and a second band barrier;
forming, through a portion of the second band barrier, a first via into the second band absorber;
placing a first conductor through the first via such that the first conductor contacts the first band barrier;
placing a second conductor in contact with the second band barrier;
forming a second via through the second band absorber and the second band barrier and separated from the first via;
placing a third conductor through the second via to contact the first band barrier within the second via; and
placing a fourth conductor to contact the second band barrier at a location closer to the second via than the first via such that the first conductor and the second conductor correspond to a first pixel of a light sensor and the third conductor and the fourth conductor correspond to a second pixel of the light sensor.

15. The method of claim 14 further comprising applying a passivation material in the first via to at least partially line the via and insulate the first conductor from the second band absorber and the second band barrier.

16. The method of claim 14 further comprising:
placing or forming a bump on the second band barrier; and
electrically connecting the first conductor and the second conductor to the bump.

17. The method of claim 14 further comprising:
depositing on the second band barrier, in order, a third band absorber and a third band barrier;
forming the first via also through the third band absorber and the third band barrier;
forming a third via through the third band absorber and the third band barrier; and
placing a fifth conductor to contact the third band barrier, wherein the second conductor extends through the third via to contact the second band barrier.

* * * * *